United States Patent [19]

Kumanoya et al.

[11] Patent Number: 4,899,313
[45] Date of Patent: Feb. 6, 1990

[54] SEMICONDUCTOR MEMORY DEVICE WITH AN IMPROVED MULTI-BIT TEST MODE

[75] Inventors: Masaki Kumanoya; Hideshi Miyatake; Katsumi Dosaka; Yasuhiro Konishi, all of Hyogo, Japan

[73] Assignee: Mitsubishi Denki Kabushiki Kaisha, Tokyo, Japan

[21] Appl. No.: 178,427

[22] Filed: Apr. 6, 1988

[30] Foreign Application Priority Data

Apr. 15, 1987 [JP] Japan .................................. 62-93514

[51] Int. Cl.$^4$ ............................. G11C 7/00; G11C 8/00
[52] U.S. Cl. ............................ 365/201; 365/189.08; 365/189.04; 365/230.03; 371/21.2
[58] Field of Search ...................... 365/189.01, 189.09, 365/189.11, 226, 233, 200, 201, 189.08, 189.04, 230.03; 371/21

[56] References Cited

U.S. PATENT DOCUMENTS

| 4,543,647 | 9/1985 | Yoshida | 365/230 |
| 4,654,849 | 3/1987 | White et al. | 365/201 |
| 4,692,901 | 9/1987 | Kumanoya et al. | 365/201 |
| 4,771,407 | 9/1988 | Takema et al. | 365/226 |
| 4,811,299 | 3/1989 | Miyazawa et al. | 365/201 |

OTHER PUBLICATIONS

IEEE Int'l. Sol. St. Cir. Conf.: "A 90 ns 1 Mb DRAM with Multi-Bit Test Mode", by M. Kumanoya et al., 2/15/85, pp. 240-241.
IEEE J. of Sol. St. Cir.: "A Reliable 1-Mbit DRAM with a Multi-Bit-Test Mode", by M. Kumanoya et al., vol. Sc. 20, No. 5, Oct. 1985, pp. 909-913.
IEEE Int'l. Sol. St. Cir. Conf.: "A 60 ns DRAM in a 300 mi DIP", by T. Sumi et al., 2/27/87, pp. 282-283.
IEEE Int'l. Sol. St. Cir. Conf.: "A 70 ns 4 Mb DRAM in a 300 mil DIP Using 4-Layer Poly", by H. Mochizuki et al., 2/27/85, pp. 284-285.
Nikkei Electronics, 1987, 4.6, No. 418, pp. 149-163, includes English translation, Ishihara et al.

Primary Examiner—A. J. Heinz
Assistant Examiner—Melissa J. Koval
Attorney, Agent, or Firm—Lowe, Price, LeBlanc, Becker & Shur

[57] ABSTRACT

A memory device provides a test mode which simultaneously carries out the function test of plural bit memory cells. In this memory device, trilevel decision is carried out based on the AND operation on the memory cell information of the selected plural bits in the single device level while bilevel decision is carried out in the board level on the basis of the OR operation on the AND result of the information of the selected plural bit memory cells and the AND result of the inverted information of the same.

15 Claims, 4 Drawing Sheets

SEMICONDUCTOR MEMORY DEVICE WITH AN IMPROVED MULTI-BIT TEST MODE

BACKGROUND OF THE INVENTION

1. Field of the Invention

The present invention relates to a semiconductor memory device and, more specifically, it relates to a semiconductor memory device which is capable of simultaneously carrying out function test of a plurality of memory cells at the time of testing whether the memory cells included in the semiconductor memory device properly function or not.

2. Description of the Prior Art

Recently, as a capacity of a semiconductor memory device comes to be larger and larger, the time required for testing whether the memory cells function properly or not becomes longer and longer. In order to solve this problem, a novel semiconductor memory device has been proposed which is capable of reducing much time required for the function test, in which, instead of the conventional function test carried out by successively reading the stored contents of the memory cells bit by bit, function tests of a plurality of memory cells are carried out simultaneously, by outputting a certain logic value outside the device when the information logic value simultaneously read from memory cells of a plurality of bits are the same (the operation mode in which the function tests of a plurality of memory cells are carried out simultaneously will be hereinafter referred to as test mode).

The semiconductor memory device provided with the test mode in which the function test of a plurality of memory cells are carried out simultaneously is disclosed in the U.S. Pat. No. 4,692 901 entitled "Semiconductor Memory" invented by M. Kumanoya et al. filed by the same applicant and issued on Sept. 8, 1987. The outline of the device disclosed in the above mentioned U.S. Patent is also disclosed in "A 90ns 1Mb DRAM with Multi-Bit Test Mode", M. Kumanoya et al, 1985 IEEE ISSCC Digest of Technical Papers, 1985, pp. 240-241, "A Reliable 1-Mbit DRAM with a Multi-Bit-Test Mode", M. Kumanoya et al, IEEE Journal of Solid-State Circuits. vol. Sc-20, No. 5, October 1985, pp. 909-912.

The above described articles are incorporated herein by reference as a prior or art.

Figure 1:
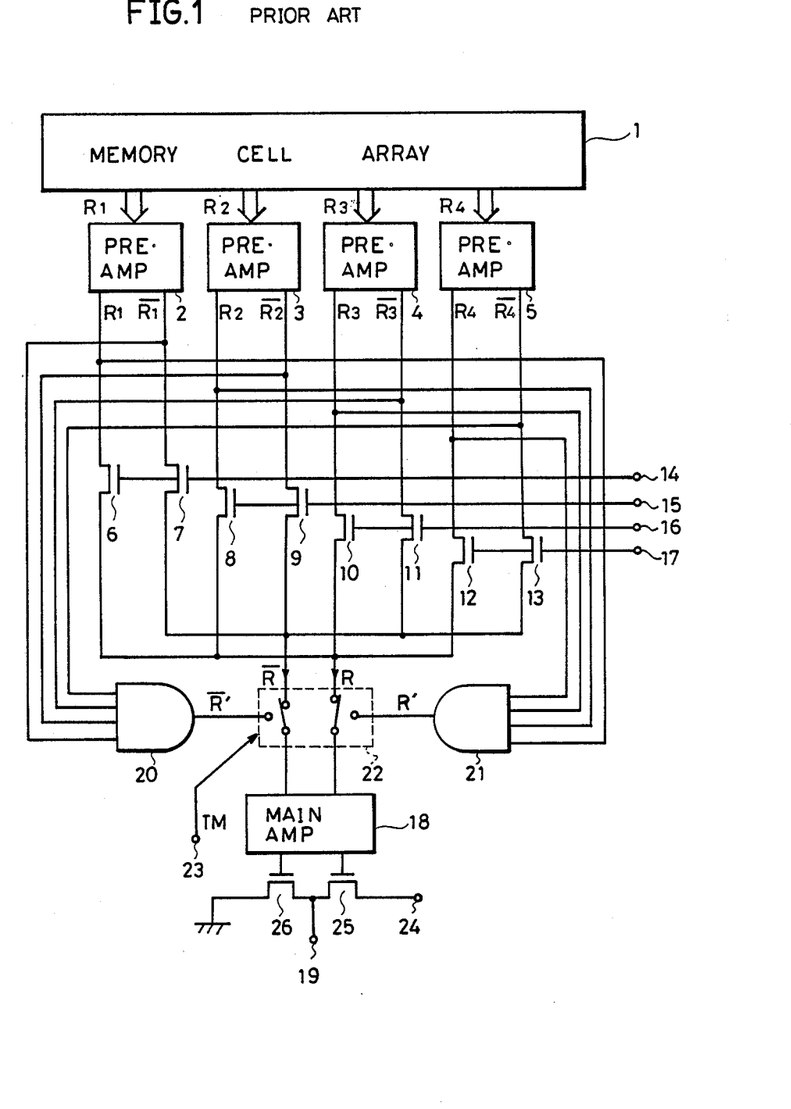
FIG. 1 shows the electrical structure of the information reading circuit portion of a conventional semiconductor memory device which is capable of test mode operation.

FIG. 1 is a block diagram mainly showing the electrical structure of the output (reading) circuit portion of a conventional semiconductor memory device capable of test mode operation, disclosed in the above mentioned prior art.

The semiconductor device shown in FIG. 1 comprises a memory cell array 1 constituted by a plurality of memory cells arranged in two dimensions of rows and columns each storing logic value information, preamplifiers 2, 3, 4 and 5 respectively receiving the stored content of the memory cell selected from the memory cell array 1 by a selection means, not shown, and generating the stored content R1, R2, R3 and R4 of the memory cell and the inverted signals $\overline{R1}$, $\overline{R2}$, $\overline{R3}$ and $\overline{R4}$ thereof, transfer gate transistors 6 to 13 which turn on/off in response to a signal obtained from subdecoding, for example, the most significant address (row and column) out of external address signals and selectively pass the signals from the preamplifiers 2 to 5, an AND gate 21 which receives the signal information R1 to R4 from the premaplifiers 2 to 5 and outputs the logical product thereof, an AND gate 20 which receives the inverted signals $\overline{R1}$ to $\overline{R4}$ from the preamplifiers 2 to 5 and outputs the logical product thereof, normal mode/test mode selecting switch 22 which selectively passes, in response to the test mode designating signal TM applied from a control signal input terminal 23, any signal R, which is one of the output signals of the preamplifiers 2 to 5 (hereinafter referred to as internal output signals) R1 to R4, $\overline{R}$, which is one of the internal signals $\overline{R1}$ to $\overline{R4}$, and either one of the AND gate 20 output $\overline{R}'$ or AND gate output R', a main amplifier 18 which receives the signal applied from the selecting switch 22 and amplifiers and outputs the same, output transistors 25 and 26 which turn on/off in response to the signal from the main amplifier 18, and external output terminal 19 for externally applying the signal applied from the node of the output transistors 25 and 26.

Although not shown, memory cell array is divided into four blocks. One memory cell from each block, namely, four memory cells in all are selected simultaneously based on external address signals, and respective stored contents are applied to the corresponding preamplifiers 2 to 5. The signals R1 to R4 read from the selected memory cells are amplified and invertedly amplified in the preamplifiers 2 to 5. Therefore, sets of signals complementary to each other, i.e. (R1, $\overline{R1}$), (R2, $\overline{R2}$), (R3, $\overline{R3}$) and (R4, $\overline{R4}$) are outputted respectively from the preamplifiers 2 to 5. The internal output signals R1 to R4 outputted from the preamplifiers 2 to 5 are connected to one line through the respective conductive paths 6, 8, 10 and 12, and applied to one input terminal of the main amplifier 18 as the signal R. The internal output signals $\overline{R1}$ to $\overline{R4}$ are connected to one line through the respective conductive paths of the transistors 7, 9, 11 and 13 and applied to the other input terminal of the main amplifier 18 as the signal $\overline{R}$. In the normal mode which is the mode other than the test mode, the signals R and $\overline{R}$ applied to the selecting switch 22 are amplified in the main amplifier 18 and then applied to the external output terminal 19 as an external output signal through the output transistors 25 and 26. One conductive terminal of the output transistor 25 is connected to the supply voltage Vcc through the supply terminal 24 and the other conductive terminal of the output transistor 26 is grounded. Therefore, when the signal R is at high level and the signal $\overline{R}$ is low level, for example, the transistor 25 turns on and the transistor 26 turns off, so that the output terminal 19 becomes high level. On the other hand, in the test mode, the output signal R' of the AND gate 21 having internal output signals R1 to R4 outputted respectively from the preamplifiers 2 to 5 as the inputs is applied to one input terminal of the main amplifier 18, while the output signal $\overline{R}'$ of the AND gate 20 having internal output signals $\overline{R1}$ to $\overline{R4}$ as the inputs is applied to the other input terminal of the main amplifier 18. The switching between the test mode and the normal mode is carried out by the selection switch 22 in response to the control signal TM applied through the control signal input terminal 23.

The subdecode signals applied to the terminals 14, 15, 16 and 17 are applied from a nibble decoder, as shown in the articles of the prior art. The operation of the function test of the memory cell will be hereinafter described.

In testing the function of the memory cells, the logic value "0" (low level) information is written, for example, in all the memory cells constituting the memory cell array 1 by the memory testing apparatus (not shown). If each of the memory cells is functioning properly, the written information "0" will be directly read from each of the memory cells. If the output of "0" is not obtained from each of the memory cells, the memory is not functioning properly, and it is determined that the memory cell is out of order. Now, assuming that each of the memory cells functions properly, the internal output signals R1 to R4 read from the preamplifiers 2 to 5, respectively, will be "0" which is the same as the previously written logic value, while the complementary signals $\overline{R1}$ to $\overline{R4}$ will be "1". On this occasion, the addresses of four memory cells simultaneously read to each of the preamplifiers 2 to 5 will be designated by decoding, for example, address signals other than the most significant bit address out of the external addresses.

When the function test is carried out in the normal mode in which the information of the selected memory cells is read bit by bit to the external output terminal 19, the terminals of the selecting switch 22 are switched by the control signal TM so as to connect the signals R and $\overline{R}$ to the main amplifier 18. On this occasion, which of the internal output signals outputted from the preamplifiers 2 to 5 should be read to the external output terminal 19 is determined dependent on which of the subdecode signals (for example, decoded signal of the most significant address of row and column) applied to the subdecode signal input terminals 14 to 17 is set at high level. For example, when a high level subdecode signal is applied only to the input terminal 14, then only the transistors 6 and 7 become conductive, the internal output signals R1 and $\overline{R1}$ the preamplifier 2 are applied to the main amplifier 18 as the signals R and $\overline{R}$, thereafter they are amplified therein and applied to the gates of the transistors 25 and 26. Therefore, on this occasion, (when the memory cell functions properly), the signal R is "0" while the signal $\overline{R}$ is "1", so that the transistor 25 turns off and the transistor 26 turns on, and a signal having the logic value of "0" (low level) is read from the external output terminal 19. The remaining subdecode signals should be made high level successively in order to read the remaining internal output signals. The operation of simultaneously reading the four memory cell information and reading the stored contents of the four memory cells bit by bit successively is known as the nibble mode operation, which is provided with a normal large capacity semiconductor memory device (for example, 1M DRAM). In this manner, the logic values for function test written in the memory cells are read bit by bit to the external output terminal 19 whereby it is determined whether each of the memory cells is good or bad one by one.

On the contrary, in the test mode in which memory cells of plural bits are tested simultaneously, the nodes of the selecting switch 22 are switched by the control signal TM so as to connect the signals R' and $\overline{R}'$ to the main amplifier 18. In this case, the AND gate 21 outputs the logical product signal R' of the four internal output signals R1, R2, R3 and R4 while the AND gate 20 outputs the logical product signal $\overline{R}'$ of the four internal output signals $\overline{R1}$, $\overline{R2}$, $\overline{R3}$ and $\overline{R4}$. More specifically, the output signal R' of the AND gate 21 becomes "1" only when all of the signals R1 to R4 become "1" and, otherwise, the signal R' will be "0". In the same manner, the output signal $\overline{R}'$ of the AND gate 20 becomes "1" only when all signals $\overline{R1}$ to $\overline{R4}$ become "1" and otherwise it will be "0". When all of the signals R1 to R4 are "1", then the complementary internal output signals $\overline{R1}$ to $\overline{R4}$ become "0". Therefore, on this occasion, the signal R'="1" and $\overline{R}'$="0". On the contrary, when all of the internal output signals R1 to R4 are "0", the complementary internal output signals $\overline{R1}$ to $\overline{R4}$ will be "1", so that R'="0" and $\overline{R}'$="1". In other cases, namely, both "0" and "1" are included in the internal output signals R1 to R4, then "0" and "1" are also included in the complementary internal output signals $\overline{R1}$ to $\overline{R4}$ so that both signals R' and $\overline{R}'$ become "0". When R'="1" and $\overline{R}'$="0" as described above, the transistor 25 turns on and the transistor 26 turns off through the main amplifier 18 and "1" is outputted from the external output terminal 19. In other words, when the internal signals R1 to R4 are all "1", then the same logic value "1" will be outputted from the external output terminal 19. On the contrary, when R'="0" and $\overline{R}'$="1", the transistor 25 turns off and the transistor 26 turns on and "0" is outputted from the external output terminal 19. Namely, when the internal output signals R1 to R4 are all "0", the same value "0" is outputted from the external output terminal 19. When R'="0" and R'="0", both transistors 25 and 26 turn off and the external output terminal 19 becomes high impedance state. Therefore, when both "0" and "1" are included in the internal output signals R1 to R4, i.e. when there exist at least one memory cell which does not function properly in the 4 bit memory cells corresponding to the internal output signals R1 to R4, then there is no output at the external output terminal 19.

As described above, by bringing the stored contents of 4 bit memory cells together as one ANDed output signal (4 bit degenerated signal) by using the AND gate, the logic value outputted from the external output terminal 19 can be assumed to be stored in all of the 4 bit memory cells. Therefore, when the logic value output thereof is equal to the logic value information previously written in the memory cells for testing the function, then it can be assumed that all of the 4 bit memory cells function properly. When no logic value information is outputted, i.e. the external output terminal 19 becomes high impedance state, it means that one or more memory cells in the 4 bit memory cells store "0" while remaining memory cells store "1", that is, at least one memory cell does not operate properly. As described above, in the test mode, the function test of 4 bit memory cells can be carried out simultaneously, so that the time required for testing the function of memory cell can be reduced to ¼ compared with the function test in the normal mode.

Since the conventional semiconductor memory device having the test mode is structured as described above, it is effective in carrying out the function test of every single device by the memory testing apparatus. However, when the semiconductor memory device is mounted on the memory board (printed circuit board), the output terminal of the semiconductor memory device is pulled up to the supply potential through a resistance in order to stabilize the output level. Therefore, even if a malfunction is detected in the test mode and the output terminal becomes high impedance state, the level of the output terminal is pulled up to the high level and the malfunction of the memory cell can not be detected and correct decision can not be given in the function test of the semiconductor memory device. Namely, at the board level, the test mode can not be used.

A memory device in which the test mode operation is carried out by applying a voltage higher than the supply voltage Vcc to the most significant address A10 pin is disclosed in "A 60ns 4Mb DRAM in a 300 mil DIP", by T. Sumi et al, 1987 IEEE ISSCC Digest of Technical Papers, pp. 282-283. However, this memory device merely outputs the result of the function test as a trilevel decision output and is not suitable for the function test after it is mounted on the board as described above.

A memory device which outputs the result of the test mode as bilevel decision output of high and low is disclosed in "A 70ns 4Mb DRAM in a 300 mil DIP using 4-Layer Poly" by H. Mochizuki et al, 1987 IEEE International Solid-State Circuits Conference, pp. 284-285. However, this memory device has no function of outputting the result of the test mode as the trilevel decision output, so that it is not suitable for the single device test mode.

In view of the foregoing, the implementation of a memory device is strongly desired which is capable of outputting the test mode result as a trilevel decision output in the single device level and capable of outputting the result as a bilevel decision output in the board level thereby carrying out the function test of the memory cells correctly in either level.

SUMMARY OF THE INVENTION

Therefore, the object of the present invention is to eliminate the above described problems and to provide a semiconductor memory device which is capable of test mode operation both in the single device level function test and the function test carried on with the device mounted on the memory board.

The semiconductor memory device in accordance with the present invention carries out at least two kinds of the logical operation for the logic value information read from memory cells of plural bits in the test mode and selects one of the result of the at least two kinds of logical operation in case of need.

One of the two kinds of logical operations provides trilevel decision output and the other provides bilevel decision output.

The means for carrying out at least two kinds of logical operation comprises the logical product operation portion constituted by the first logical product means for taking the logical product of the first plural bit memory cell information and the second logical product means for taking the logical product of a second plurality of information complementary to each of the first plural bit memory cell information, and logical product/logical sum operation portion constituted by the logical sum means for taking the logical sum of the first and second logical product means output and inversion means for outputting the logical inversion of the logical sum means output.

The switching of the results of operation is effected by the presence/absence of a voltage higher than the supply voltage applied to the external address input pin terminal which becomes unnecessary in the test mode.

In the function test of the single device, trilevel decision is carried out. Namely, in this case, the logical product operation is selected and when the memory cells operate properly, the logical product output of the plural bit memory cell information, that is, the expected value of the information of the selected memory cells is outputted. When the memory cells do not operate properly, then the output of the test result will be the high impedance state. On the other hand, in the function test after the device is mounted on a memory board, bilevel decision will be carried out. Namely, in this case, the logical product/logical sum operation is selected. When the memory cells operate properly, the logical product means output includes "1" so that the result of the logical product/logical sum operation will be "1" and if a memory cell which does not function properly is included in the memory cells, both logical product means outputs become "0" so that the result of the logical product/logical sum operation will be "0". Therefore, the function test of the semiconductor memory device can be carried out in test mode even after the device is mounted on a memory board.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
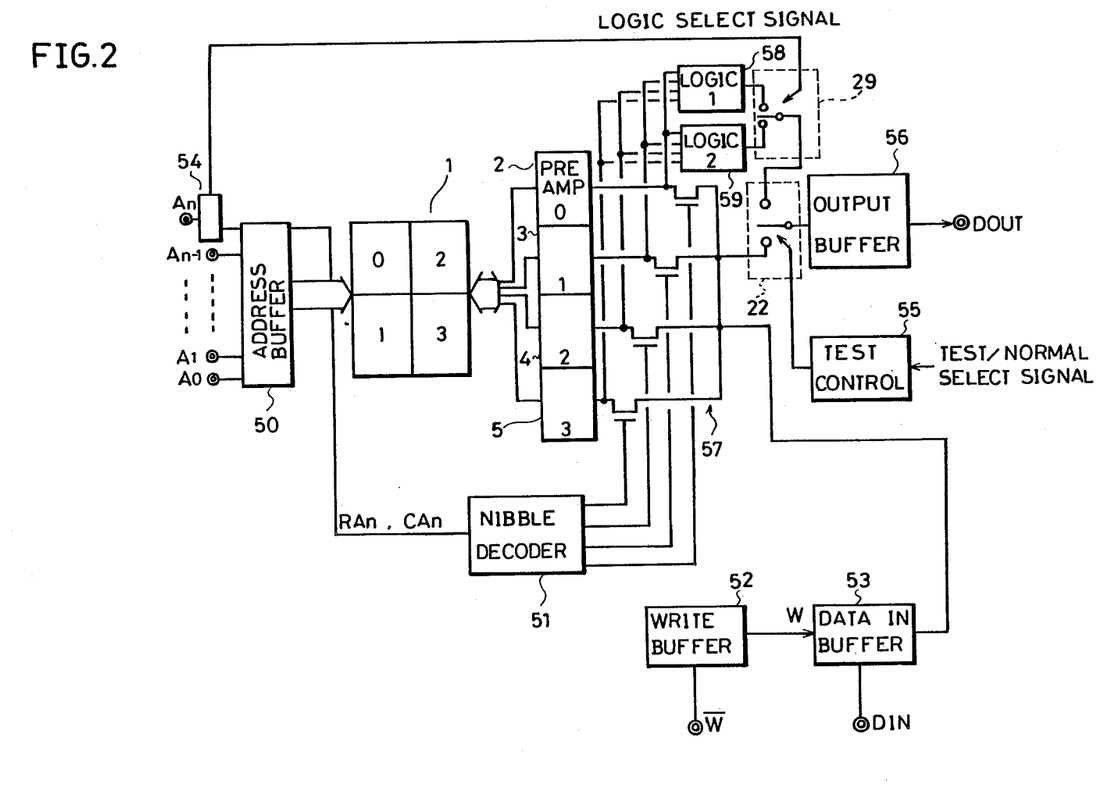
FIG. 2 schematically shows the whole structure of a semiconductor memory device in accordance with one embodiment of the present invention.

FIG. 2 schematically shows the whole structure of the semiconductor memory device in accordance with one embodiment of the present invention.

Referring to FIG. 2, as a memory cell selection portion, provided are an address buffer 50 which receives address signals A0 to An applied to the address input terminals A0 to An and generates internal address signals, an input selection circuit 54 which selectively applies the address signal An applied to the address input terminal An to the address buffer 50 in response to the test/normal select signal and generates a logic select signal based on the signal level of the address signal An, and a nibble decoder 51 which subdecodes the internal address signals RAn and CAn from the address buffer 50 to selectively turn on/off the nibble switch 57. The address signals RAn and CAn are, for example, the most significant row and column address signals.

The memory array is divided into four sections 0 to 3 and 1 bit memory cell is selected from each memory block in response to the internal address signal from the address buffer 50. The simultaneously selected 4 bit memory cells are respectively connected to the preamplifiers 2 to 5 which are provided corresponding to each of the blocks.

The nibble switch 57 selectively connects the preamplifiers 2 to 5 to the output buffer 56 and the data-in buffer 53 in response to the subdecode signal from the nibble decoder 51. Therefore, in the normal mode, one of the preamplifiers 2 to 5 is connected to the buffers 56 and 53. In the nibble mode, the preamplifiers are successively and sequentially connected to the buffers 53 and 56, starting from the preamplifier corresponding to the first selected memory cell.

The data-in buffer 53 is activated in response to the signal W from a write buffer 52 which receives a write enable signal $\overline{W}$ and generates an internal write enable signal W, and applies the input data Din to one of the preamplifiers 2 to 5.

In order to carry out the function test of the memory cell, there are provided a first logical operation block 58 which receives the 4 bit memory cell information from the preamplifiers 2 to 5 and carries out a predetermined first logical operation, a second logical operation block 59 which receives the 4 bit memory cell information from the preamplifiers 2 to 5 and carries out a predetermined second logical operation, a logic selection switch 29 which selectively passes either of the outputs of the first and second logical operation blocks 58 and 59 in response to a logic select signal from the input selection circuit 54, and a mode selection switch 22 which selectively applies the output of the logic selection switch 29 or the output of the nibble switch 57 to the output buffer 56 in response to the mode selection signal from the test control block 55.

Figure 3:
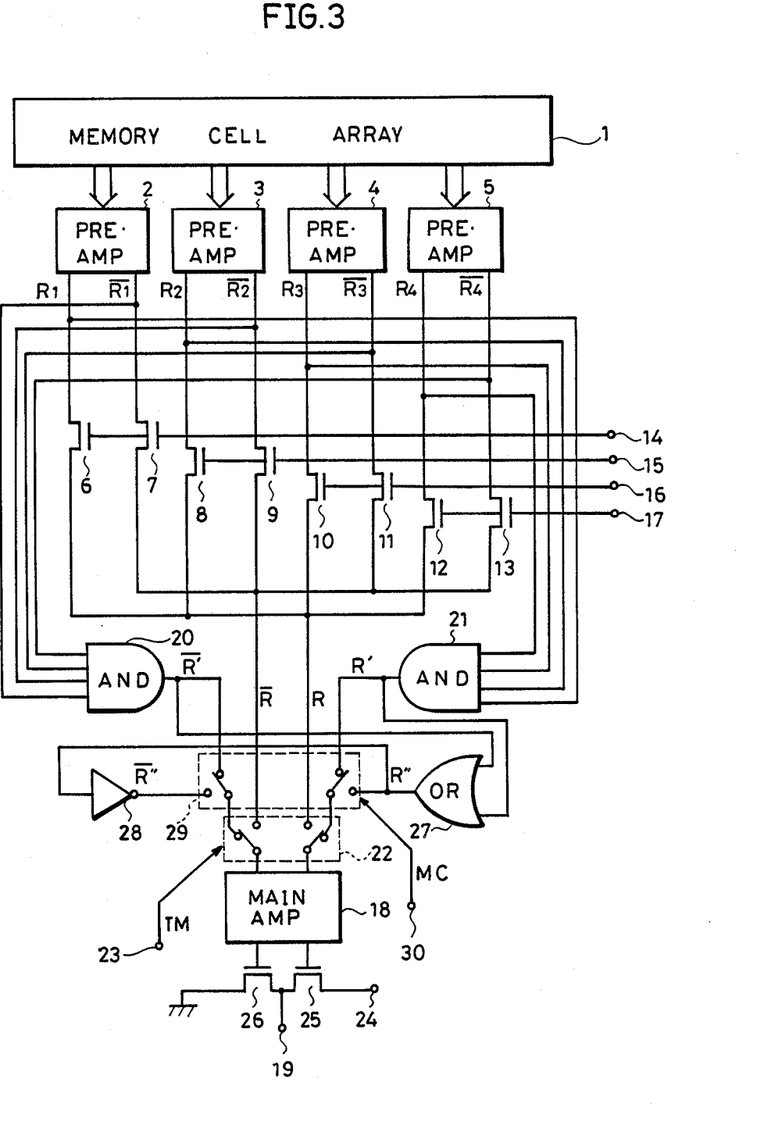
FIG. 3 is a block diagram showing the electrical structure of the information reading circuit portion of the semiconductor memory device in accordance with one embodiment of the present invention.

FIG. 3 is a detailed block diagram of the information reading portion of the semiconductor memory device shown in FIG. 2.

The first logical product block 58 is constituted by an AND gate 21 which receives the 4 bit information R1 to R4 from the preamplifiers 2 to 5 and an AND gate 20 which receives the 4 bit inverted information $\overline{R1}$ to $\overline{R4}$ from the preamplifiers 2 to 5.

The second logical operation block 59 is constituted by AND gates 20 and 21, an OR gate 27 which receives the signals R' and $\overline{R'}$ from the AND gates 20 and 21, and an inverter 28 which inverts the output signal R" of the OR gate 27.

The output buffer 56 is constituted by a main amplifier 18 and transistors 25 and 26.

In other words, as is apparent from the comparison between the structures shown in FIGS. 1 and 3, in one embodiment of the present invention, besides the conventional semiconductor memory device shown in FIG. 1, an OR gate 27 which has the logical product signals $\overline{R'}$ and R' applied from the AND gates 20 and 21 as its inputs and an inverter 28 which inverts the logic of the output signal R" of the OR gate 27 and outputs the same are added. In addition, a selection switch 29 is provided for selecting either the output signal $\overline{R'}$ or R' of the AND gates 20 and 21 and output R" of the OR gate 27 or the output $\overline{R''}$ of the inverter 28. The selection switch 29 is controlled by a control signal MC which is provided from the second control node 30. The control signal MC is applied through an external address input pin terminal (An address pin) which become & unnecessary in the test mode and an input selection circuit 54. The selection switch 29 selects outputs of AND gates 20 and 21 and applies the same to the selection switch 22 when the control signal MC becomes higher than the operation supply voltage Vcc, and otherwise, it selects the output R" of the OR gate 27 and the of the inverter 28 and applies the same to the selection switch 22.

Now, the address input pin terminal (An pin in FIG. 2) becomes unnecessary in the test mode, since 4 bit memory information is read in parallel in the test mode and the selection of the 1 bit memory cell is not necessary.

The control signal TM is generated by the test control block 55 in response to the test/normal select signal designating the operation mode and is applied to the terminal 23. The control signal MC is generated by the input select circuit 54 and is supplied to the node 30. The operation will be hereinafter described.

First, in the normal mode, the selection switch 22 has its terminals connected so as to apply the signals R and $\overline{R'}$ obtained from the internal output signals R1 to R4 and $\overline{R1}$ to $\overline{R4}$ from the preamplifiers 2 to 5 to the main amplifier 18 in response to the control signal TM. In this state, the 4 bit memory cell information selected by an external address are respectively applied to the preamplifiers 2 to 5. Thereafter, a subdecode signal which is obtained by subdecoding, for example, the most significant address out of the external addresses is applied from the nibble decoder 51 to the terminal 14 to 7, whereby the transistors connected to the terminal to which "H" signal is applied turn on, so that one set of signals out of the internal output signals R1 to R4 and $\overline{R1}$ to $\overline{R4}$ are applied to the main amplifier 18. Consequently, the information contained in the memory cell is applied to the external output terminal 19 by 1 bit unit.

Next, the test mode for a single device level will be described. In this case, first the selection switch 22 has its terminals connected to receive the output of the selection switch 29 in response to the control signal TM applied to the terminal 23. Thereafter, the control signal MC is applied to the input terminal 30 through the external address input pin terminal (An address pin) which becomes unnecessary in the test mode and through the input selection circuit 54, whereby the selection switch 29 has its terminals connected to select the outputs of the AND gates 20 and 21. Therefore, in the similar manner as in the conventional device, the internal output signals $\overline{R1}$ to $\overline{R4}$ and R1 to R4 corresponding to the 4 bit memory cell information read through preamplifiers 2 to 5 are respectively applied to the AND gates 20 and 21, and the outputs $\overline{R'}$ and R' of the AND gates 20 and 21 are applied to the main amplifier 18. Consequently, in the function test mode in a single device level, one of the high, low, high impedance state signals is applied to the external output terminal 19 in response to the outputs $\overline{R'}$ and R' of the AND gates 20 and 21.

The operation in the test mode after the semiconductor memory devices mounted on the memory board will be hereinafter described. On this occasion, the selection switch 29 has its terminals connected to select the outputs R" and $\overline{R''}$ of the OR gate 27 and inverter 28 in response to the control signal MC. In this case also, the operation is similar to the conventional single device test mode until the outputs $\overline{R'}$ and R' of the AND gates 20 and 21 are obtained. Namely, when all of the selected 4 bit memory cells store "1", then R'="1" and $\overline{R'}$="0", while all of the selected 4 bit memory cells store "0", then R'="0" and $\overline{R'}$="1". When at least 1 bit memory cell stores a value different from the value written for the function test, that is, there is a malfunction, then R'="0" and $\overline{R'}$="0". Therefore, when all of the 4 bit memory cells properly store "1" or "0", the output R" of the OR gate 27 will be "1" since either the output $\overline{R'}$ or R' of the AND gates 20 and 21 becomes "1". When at least one memory cell does not operate properly, then the output R" of the OR gate 27 will be "0". Meanwhile, the output signal of the inverter 28 having the output R" of the OR gate 27 as its input respectively becomes "0" and "1". Therefore, when the selected memory cells operate properly, the transistor 25 turns on and the transistor 26 turns off through the main amplifier 18, so that the logic value "1" is applied to the external output terminal 19. When at least 1 bit memory cell does not function properly, then the transistor 26 turns on and the transistor 25 turns off through the main amplifier 18, so that the logic value "0" is applied to the external output terminal 19. Therefore, after the semiconductor memory device is mounted on the memory board, the function test can be carried out by the bi-level decision of high state and low state, avoiding the high impedance state.

One example of a definite structure of the input selection circuit for generating the control signal MC for the selection switch 29 will be described with reference to FIG. 4.

Figure 4:
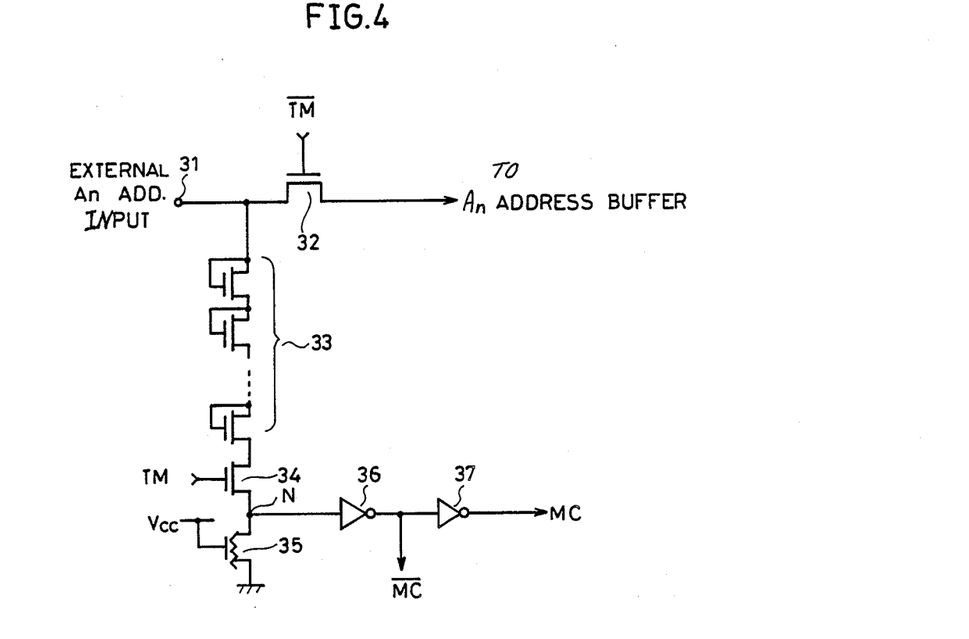
FIG. 4 shows one example of a circuit structure for generating logical operation switching signal shown in FIGS. 2 and 3.

In FIG. 4, the input selection circuit generating the control signal MC comprises an input terminal 31 which receives the selection designating signal for the single device test mode and the test mode after the device is mounted on a board, a transistor 32 which turns on/off in response to the inverted signal $\overline{TM}$ of the control signal TM designating the test mode and electrically connects the input terminal 31 to the address buffer (see FIG. 2), a resistance transistor 33 connected to the input terminal 31, a transistor 34 connected in series with the resistance transistor 33 and which turns on/off in response to the control signal TM, a transistor 35 connected between the transistor 34 and ground which receives the supply voltage Vcc at its gate, an inverter receives the output at the node N of the transistors 34 and 35 and outputs the signal $\overline{MC}$, and an inverter 37 which receives and inverts the output signal of the inverter 36 and outputs a signal MC. The resistance transistor 33 is constituted by a series of k transistors each resistance-connected. Since at least one external address signal becomes unnecessary in the test mode, this unnecessary external address input terminal such as An pin is used as the input terminal 31. For example, in 1 megabit DRAM (Dynamic Random Access Memory), when 4 bit memory cells are simultaneously tested in the test mode, the most significant external address signal on A9 pin becomes unnecessary, so that the A9 address input terminal may be used as the input terminal 31 for the control signal generation circuit. The operation will be described in the following.

In the normal mode, the signal TM is set at a low level and the inverted signal $\overline{TM}$ is set at a high level. Consequently, the transistor 32 turns on and the transistor 34 turns off. Therefore, the external address An applied to the input terminal 31 is transferred to the internal An address buffer through the transistor 32. This enables reading the information stored in the memory cell to the external output terminal by 1 bit unit.

Next, in the test mode, the control signal TM is set at high level and the inverted control signal $\overline{TM}$ is set at low level. Consequently, the transistor 32 turns off while the transistor 34 turns on. Now, when a voltage higher than the threshold voltage defined by the k series transistors ($k \times V_{TH}$: $V_{TH}$ is the threshold voltage of one transistor) is applied to the input terminal 31, all of the k transistors constituting a resistance transistor 33 turn on. On this occasion, by appropriately setting the conductance ratio of the resistance transistor 33 and the transistor 35 having a long channel length (low conductance), the node N can be set at a high level. At this time, namely, when the level of the node N becomes high, the output signal $\overline{MC}$ of the inverter 36 becomes low level and the output signal MC of the inverter 37 becomes high level. By setting $k \times V_{TH}$ higher than the supply voltage Vcc, the control signal MC can be made to become high level only when a voltage higher than the supply voltage Vcc is applied to the input terminal 31. When a voltage lower than that value is applied to the input terminal 31, any of the k transistors constituting the resistance transistor 33 turns off, so that the node N is kept at a low level through the transistor 35 and the control signal MC remains at the low level. By using a voltage higher than the supply voltage as the signal for generating the control signal, the single device test mode can be surely distinguished from the test mode after the mounting of the device on the memory board.

Figure 5:
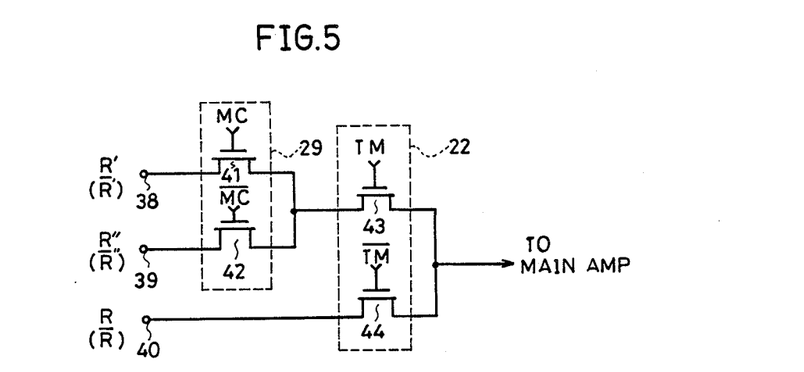
FIG. 5 shows one example of a definite structure of the normal mode/test mode selecting switch shown in FIGS. 2 and 3.

FIG. 5 shows one example of a specific structure of the selection switches 22 and 29. The selection switch 22 is constituted by transistors 43 and 44 while the selection switch 29 is constituted by transistors 41 and 42. In the figure, only the structure applied to the one input of the main amplifier is illustrated and the same structure as shown in FIG. 5 is provided at the path for applying signals to the other input. More specifically, the selection switch 29 comprises a transistor 41 which turns on/off in response to the control signal MC applied to its gate and which transmits the AND gate output R' (or R'), and a transistor 42 which turns on/off in response to the control signal $\overline{MC}$ and transmits the OR gate output R" (or the inverter output R") applied to the input terminal 37.

The selection switch 22 comprises a transistor 43 which turns on/off in response to the control signal TM and transmits the output of the selection switch 29, and a transistor 44 which turns on/off in response to the control signal $\overline{TM}$ for transmitting the signal R (or $\overline{R}$) from the preamplifiers. The operation will be described in the following.

In the normal mode, the control signal $\overline{TM}$ becomes high level and the control signal TM becomes low level. Therefore, the transistor 43 turns off and the transistor 44 turns on, so that the internal output signal R (and $\overline{R}$) inputted to the terminal 40 is transmitted to the main amplifier. In the test mode, the control signal TM becomes high level and the control signal $\overline{TM}$ becomes low level. On this occasion, assuming that the control signal MC becomes high level and the control signal $\overline{MC}$ becomes low level by means of the circuit shown in FIG. 4, then the transistor 41 turns on and the transistor 42 turns off, so that the logical product output R' (R') inputted to the terminal 38 is selected and transmitted to the main amplifier. Namely, the single device test mode is selected and trilevel decision is carried out for the logical product output. On the other hand, when the control signal MC becomes low level and the control signal $\overline{MC}$ becomes high level, then the transistor 41 turns off and the transistor 42 turns on, so that the logical sum output R" (and the inverter output R") of the logical product inputted to the terminal 39 is transmitted to the main amplifier. Therefore, the test mode after the semiconductor memory device is mounted on a memory board is carried out.

Although the description was made of a semiconductor memory device in which the stored contents of 4 bit memory cells are simultaneously read and one external output signal is taken out from the stored contents of the 4 bit memory cells in the foregoing, the number of bits of the memory cells read at one time may be any desired number and to apply the present invention. The type of the semiconductor memory device is not limited to the above described dynamic type and any other type semiconductor memory device can provide the same effect as in the above described embodiment.

In addition, it is apparent that the time for testing can be further reduced by incorporating parallel writing means for writing information simultaneously to a plurality of bits of the memory cell.

Although the test mode operation is structured such that trilevel decision is carried out when the voltage higher than the supply voltage is applied to the input terminal and bilevel decision is carried out otherwise in the above described embodiment, the level of the control signals can be theoretically reversed.

In addition, although in the above described embodiment, the control signal TM is generated in response to the externally applied test/normal select signal, the control signal TM may be generated by changing a timing relation between a plurality of clock signals used in a conventional DRAM.

As described above, the present invention provides the function for carrying out the operation for trilevel decision and the operation for bilevel decision for the memory cell information read in parallel and either one of the trilevel decision and bilevel decision can be selected to meet the necessity, so that the test mode operation becomes possible both in the single device level and in the board level.

In addition, since the two kinds of operation can be switched, depending on need, by using an address input terminal which becomes unnecessary in the test mode, so that the semiconductor device having test mode both in the single device function test and the function test with the device mounted on a memory board can be implemented without newly providing a dedicated pin terminal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a memory cell array constituted by a plurality of memory cell bits each of which storing information, and internal signal generation means which reads and outputs simulataneously the information stored in the plural bit memory cells from said memory cell array, provided with operation modes including: a normal mode, in which the information is read from said internal signal generation means based on an external address; and a test mode, in which the information from said internal signal generation means is received by plural bit unit and a logic value corresponding to said received plural bit information is outputted, said device comprising:
   logical operation means which receives plural bit memory cell information simultaneously from said internal signal generation means and carries out selectively at least two predetermined logical operations for outputting results from said at least two predetermined logical operations;
   a first terminal for receiving a logical operation select signal;
   first selection means for selectivity outputting one of the results of the at least two logical operations carried out by said logical operation means in response to said logical operation select signal;
   a second terminal for receiving a signal for selecting one of said test mode and said normal mode; and
   second selection means which passes said first selection means output in said test mode and which passes the memory cell information from said internal signal generation means in said normal mode.

2. A semiconductor memory device according to claim 1, wherein the plural bit memory cell information to said internal signal generation means is selected by external address signals except at least one external address signal whereby, in said test mode, at least one of the pin terminals receiving said external address signals becomes unnecessary, so that said logical operation selection signal is generated in response to the signal applied through said unnecessary external address input pin terminal.

3. A semiconductor memory device according to claim 1, wherein said logical operation selection signal comprises a first level which is higher than the operation supply voltage of said semiconductor memory device and a second level which is lower than said first level.

4. A semiconductor memory device according to claim 3, wherein the output of said first operation means is selected when said logical operation select signal is at said first level and the output of said second operation means is selected when said logical operation select signal is at said second level.

5. A semiconductor memory device according to claim 3, wherein said first operation means provides trilevel output and said second operation means provides bilevel output.

6. A semiconductor memory device according to claim 2, wherein said first means selectively connects the external address input terminal which should be unnecessary in said test mode to the address buffer in response to the signal of said second terminal.

7. A semiconductor memory device comprising a memory cell array formed by a plurality of memory cells for storing information, and internal signal generation means for reading and outputting simulataneously multiple bit information stored respectively in a plurality of memory cells from said memory cell array, said memory device being operative selectively in a normal mode in which information is read from said memory array based on an external address and in a test mode in which information from said internal signal generation means is received in plural bit units and a logic value corresponding to said received plural bit information is outputted, said device comprising:
   first logical operation means responsive to said internal signal generation means for carrying out a first logical operation on said multiple bit information and for generating a result of said first logical operation;
   second logical operation means responsive to said internal signal generation means for carrying out a second logical operation on said multiple bit information and for generating a result of said second logical operation;
   means for receiving a first control signal having a first voltage level which is higher than the operational supply voltage of said semiconductor memory device and a second voltage level that is lower than said first voltage level;

first switching means responsive to said first control signal for selecting an output of one of said first and second logical operation means;

means for receiving a second control signal for selecting one of said test mode and said normal mode of operation of said memory device;

an output terminal; and second switching means responsive to said second control signal selecting said test mode for supplying an output of said first switching means to said output terminal.

8. A semiconductor memory device as recited in claim 7, wherein said first logical operation means provides a trilevel output and said second logical operation means provides a bilevel output.

9. A semiconductor memory device as recited in claim 8, wherein said first means for receiving a first control signal and said second means for receiving a second control signal comprise at least a separate input terminal.

10. A semiconductor memory device as recited in claim 9, wherein said separate input terminal is connected to receive said first control signal, and said first switching means is responsive to said first voltage level of said first control signal higher than the operational supply voltage of said semiconductor memory device by selecting said trilevel output of said first logical operation means, said first switching means otherwise selecting said bilevel output of said second logical operation means.

11. A semiconductor memory device as recited in claim 9, wherein said first means for receiving a first control signal and said second means for receiving a second control signal comprise first and second terminals, said first terminal receiving said first control signal for switching between trilevel and bilevel operation and said second terminal receiving said second control signal for selection of a test and a normal mode of operation.

12. A semiconductor memory device as recited in claim 9, wherein said second control signal for selecting one of said test mode and said normal mode of operation of said memory device is generated by means responsive to a timing relationship between a plurality of clock signals used in said semiconductor memory device.

13. A semiconductor memory device according to claim 1, wherein said logical operation means carries out a first operation for outputting a trilevel output signal identifying the information stored in each of the plural bit memory cells from said memory cell array as having a single first logic value common to all said memory cells, a single second logic value common to all said memory cells, or as not having a common value, and said logical operation means further carries out a second operation for outputting a bilevel output signal identifying the information stored in each of the plural bit memory cells from said memory cell array has having a single logic value common to all said memory cells or as not having a single logic value common to all said memory cells.

14. A semiconductor memory device as recited in claim 1, further comprising an external output terminal means for outputting read-out data from memory cells in a normal mode of operation and for outputting results of the logical operation in a test mode of operation.

15. A semiconductor memory device comprising a memory cell array formed by a plurality of memory cells for storing information, and internal signal generation means for reading and outputting simultaneously multiple bit information stored respectively in a plurality of memory cells from said memory cell array, said memory device being operative selectively in a normal mode in which information is read from said memory array based on an external address and in a test mode in which information from said internal signal generation means is received in plural bit units and a logic value corresponding to said received plural bit information is outputted, said device comprising:

first logical operation means responsive to said internal signal generation means for carrying out a logical product of said multiple bit information to obtain a first multiple bit output signal;

second logical operation means responsive to said first logical operation means for carrying out a logical sum of said first multiple bit output signal to obtain a second multiple bit output signal;

means for receiving a control signal selecting a first or second testing mode of operation;

an output terminal; and switching means responsive to said control signal for applying said first multiple bit output signal or said second multiple bit output signal, selectively, to said output terminal.

* * * * *